United States Patent
Marxer et al.

(10) Patent No.: US 8,482,833 B2
(45) Date of Patent: Jul. 9, 2013

(54) MICROMECHANICAL ELEMENT MOBILE ALONG AT LEAST ONE AXIS OF ROTATION

(75) Inventors: Cornel Marxer, Neuchatel (CH); Peter Herbst, Chaumont (CH)

(73) Assignee: Sercalo Microtechnology Ltd., Schaan (LI)

( * ) Notice: Subject to any disclaimer, the term of this patent is extended or adjusted under 35 U.S.C. 154(b) by 28 days.

(21) Appl. No.: 13/311,126

(22) Filed: Dec. 5, 2011

(65) Prior Publication Data

US 2012/0140303 A1 Jun. 7, 2012

(30) Foreign Application Priority Data

Dec. 7, 2010 (EP) ..................................... 10194039

(51) Int. Cl.
*G02B 26/08* (2006.01)

(52) U.S. Cl.
USPC .................. 359/224.1; 359/199.2; 359/200.6; 359/298; 310/309

(58) Field of Classification Search
USPC ...................... 359/198.1–199.4, 200.6–200.8, 224.1–224.2, 298; 310/40 MM, 309, 311
See application file for complete search history.

(56) References Cited

U.S. PATENT DOCUMENTS

| 6,736,521 B1 | 5/2004 | Turner |
| 2001/0021058 A1* | 9/2001 | McClelland et al. ......... 359/223 |
| 2003/0142383 A1* | 7/2003 | Nanjyo et al. ................ 359/224 |

FOREIGN PATENT DOCUMENTS

| DE | 10 2006 036 499 A1 | 1/2008 |
| WO | WO 2008/118451 A1 | 10/2008 |

OTHER PUBLICATIONS

European Search Report issued Jun. 16, 2011, in European Application No. 10 19 4039, filed Dec. 7, 2010.

* cited by examiner

*Primary Examiner* — James Phan
(74) *Attorney, Agent, or Firm* — Oblon, Spivak, McClelland, Maier & Neustadt, L.L.P.

(57) ABSTRACT

The invention concerns a micromechanical element including a frame, a moving part rotating inside said frame, about an axis, two torsion beams connecting the moving part to said frame, aligned along the axis and provided with a portion of reinforced width, and stop members arranged on both sides of the reinforced portions, so as to limit the lateral movement of the moving part. According to the invention, the portions of reinforced width are integral with the frame, and the stop members are integral with the moving part.

9 Claims, 3 Drawing Sheets

MICROMECHANICAL ELEMENT MOBILE ALONG AT LEAST ONE AXIS OF ROTATION

This application claims priority from European Patent Application No. 10194039.3 filed Dec. 7, 2010, the entire disclosure of which is incorporated herein by reference.

The present invention relates to electromechanical microsystems, known as MEMS. More specifically, it concerns a micromechanical element mobile along at least one axis of rotation.

These micromechanical elements are, for example, micromirrors used in optical fibre transmission devices, such as switches, filters or demultiplexers. In the form of matrices, they are fitted, in particular to optical cross connects. With dimensions ranging from several tens of micrometers to several millimeters, they are conventionally made from silicon on insulator wafers, by methods well known to those skilled in the art. They include a mobile part rotating along at least one axis, made integral with a support element, formed of a frame, by means of two torsion elastic beams.

The moving part is conventionally activated in rotation by electrostatic forces (combs or capacitors with flat electrodes), or in a variant, by magnetic, piezoelectric or electromechanical means, using a micro-motor. It has an amplitude of rotation on the order of 10 to 15 degrees, depending on the geometry of the torsion beams, in particular their length to width ratio, which determines the return force applied. This ratio is generally comprised between 3 and 30, where the width is on the order of 1-3 micrometers and the length from 10 to 30 micrometers.

Owing to their dimensions and the stresses to which they are subjected, the beams are the most fragile elements in these micromechanical devices. For mirrors of large dimensions (several millimeters) and of significant mass, the torsion beams are also subjected to significant forces, in the event of shocks or strong accelerations. These forces may cause one of the beams to break, in particular at the join with the moving part or the frame, rendering the micromechanical device inoperative. Anti-shock devices which include stop structures have thus been developed to avoid this problem.

One of these structures is disclosed in DE Patent No 10 2006 036499, which discloses a silicon micromirror including a moving part connected to a frame via two torsion beams, which include a portion that is reinforced in width, integral with the moving part. The frame extends rigidly on both sides of said portions, so as to form stop members limiting the lateral movement of the beams. When an abrupt acceleration occurs, the moving part moves laterally, until the reinforced portions of the beams come into contact with the stop members. The elastic deformation of the beams remains within the limits of the elasticity range of silicon and this thus prevents the beams from breaking.

This device is advantageous since it has a simple structure and good level of efficiency. However, the space it requires constitutes a significant drawback. Indeed, since the active part of the micromirror is formed of the moving part, and the inactive part is the frame, the active surface to inactive surface area ratio of the micromirror is low, because of the large surface area occupied by the stop members. This ratio needs to be maximised, essentially because of the high costs of the raw material and the methods of fabricating these devices.

The present invention overcomes this drawback, by proposing a silicon micro-device, including an active part that is mobile about an axis of rotation and a frame, the active surface of which is large relative to the inactive surface. More specifically, the invention concerns a micromechanical element including a frame, a mobile part rotating inside the frame, about an axis AA, two torsion beams connecting the moving part to the frame, aligned on axis AA and provided with a portion of reinforced width, and stop members arranged on both sides of the reinforced portions, so as to limit the lateral movement of the moving part. According to the invention, the portions of reinforced width are integral with the frame, and the stop members are integral with the moving part.

Owing to these features, the space required for the frame can be reduced relative to the surface area of the moving part, which constitutes an advantage in terms of the cost of fabricating and integrating the device.

The features and advantages of the present invention will appear from the following description, given with reference to the annexed drawings, and providing, by way of explanatory, but non-limiting example, an advantageous embodiment of a micromechanical element according to the invention. In the drawings.

Figure 1:
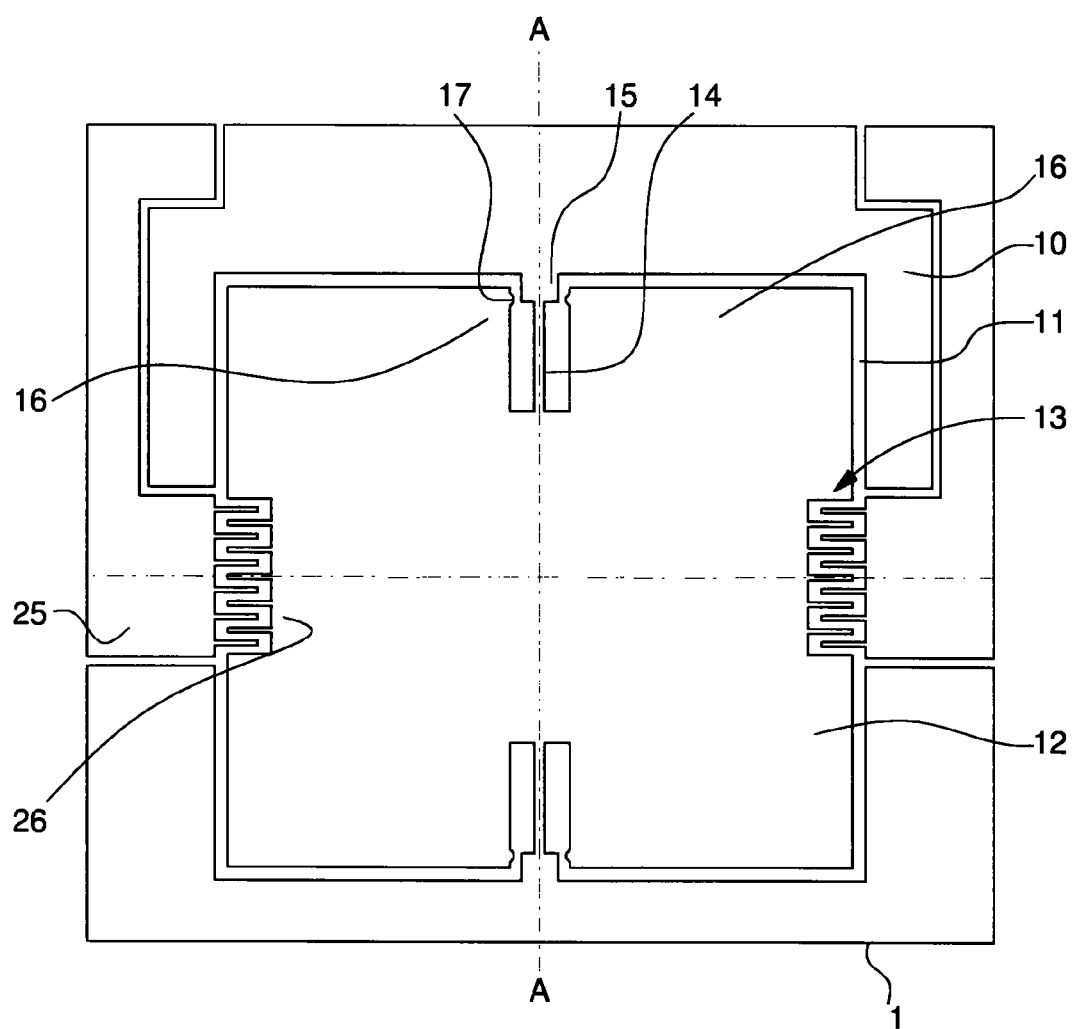
FIG. 1 is a top view of a first embodiment of a micromechanical element according to the invention.

The micromechanical element shown in FIG. 1 and referenced 1 as a whole, includes a fixed frame 10, delimiting an inner space 11, occupied by a moving part 12 rotating about a geometric axis AA. Said moving part 12 forms the active part of micromechanical element 1, as opposed to the passive part, which is formed by frame 10. The moving part is formed, for example, of a micromirror, a micro-lens, a microdiffraction grating or any other optical or mechanical microelement of millimetric dimensions or smaller. Moving part 12 is conventionally connected to said frame 10 by two torsion beams 14 aligned along axis of rotation AA. At the point of equilibrium, it is parallel to the plane formed by fixed frame 10 but raised relative thereto. The dimensions of beams 14 are arranged to provide them with a determined torsion elasticity, and a relatively high level of lateral rigidity, i.e. perpendicular to axis AA.

Micromechanical element 1 further includes electrostatic control electrodes 13 for moving part 12, including first combs 25, integral with frame 10 and raised relative to moving part 12 and second combs 26 integral with moving part 12. Said combs 25, 26 penetrate each other so as to exert a force of mutual attraction or repulsion, depending upon the potential differential applied. This force activates moving part 12 in rotation about axis AA. In a variant, the moving part may be moved by various magnetic, electromechanical or piezoelectric means.

The assembly of frame 10-moving part 12-combs 25 is formed of semiconductor material, for example from a double silicon on insulator wafer, including a substrate, first and second thin silicon layers, and thin oxide layers separating the various silicon layers. Frame 10 is formed in the substrate, whereas moving element 12 and combs 25 are formed in the first and second silicon layer respectively. The physicochemical methods employed for structuring the double silicon on insulator wafer are well known to those skilled in the art. For further details regarding the fabrication technique used, reference may be made to WO Patent No 2008 118451.

Micromechanical element 1 operates in a conventional manner. When electrostatic combs 25 exert an attraction force on moving part 12, the latter rotates through an angle of 1 to 15 degrees relative to its position of equilibrium. When the attraction force is deactivated, moving part 12 returns to its position of equilibrium owing to the return force exerted by torsion beams 14.

According to the invention, torsion beams 14 include a portion 15 of reinforced width, integral with frame 10. The length of said portions 15 of reinforced width is typically comprised between a third and a tenth of that of beams 14. Owing to their geometry, said portions have negligible torsion elasticity compared to that of beams 14, and very high lateral rigidity. Moreover, moving part 12 extends on both sides of torsion beams 14, substantially parallel to axis AA, as far as the edge of frame 10, in proximity to reinforced portions 15. It thus forms four stop members 16, arranged on both sides of reinforced portions 15, for limiting the movements of moving part 12 perpendicularly to axis of rotation AA. In the embodiment described with reference to FIG. 1, said stop members 16 are rigid. They advantageously include catches 17, which project in the direction of reinforced portions 15 to come as close thereto as possible. Typically, stop members 16 are 3 to 15 micrometers from reinforced portions 15.

The assembly of reinforced portions 15-stop members 16 forms an anti-shock structure for protecting micromechanical element 1 from abrupt accelerations in the direction perpendicular to axis of rotation AA. The action mode of the assembly is as follows. When moving part 12 moves perpendicularly to axis of rotation AA, under the effect of an unexpected shock or acceleration, stop members 16 come into contact with reinforced portions 15 and the lateral movement is quickly blocked. Since the amplitude of lateral movement is low, the lateral stresses exerted on torsion beams 14 are limited, and the velocity of moving part 12 at the end of travel is low. Any breakage of torsion beams 14 is thus prevented.

Figure 2:
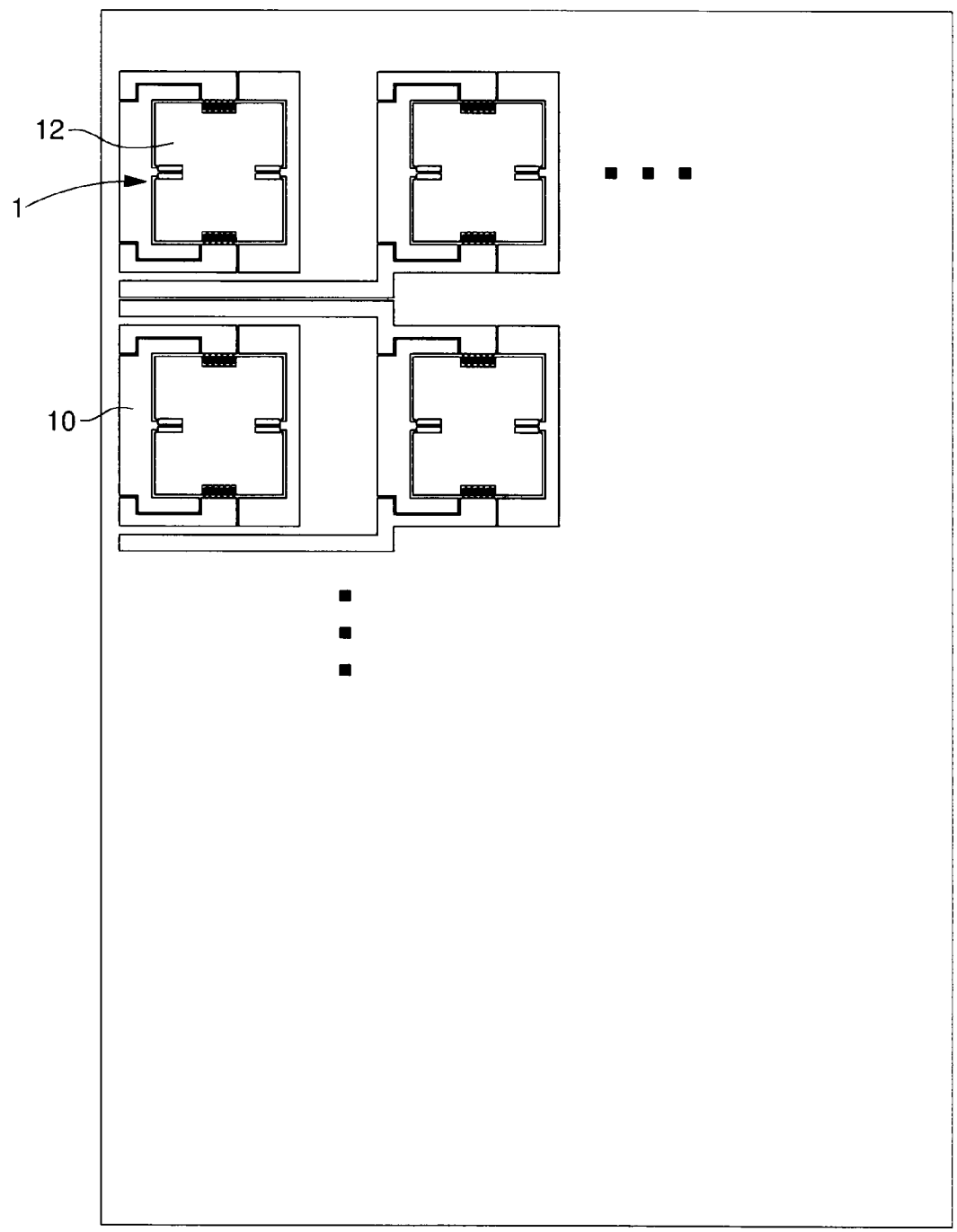
FIG. 2 is a top view of an array of micromechanical elements according to the invention.

Moreover, owing to the ingenious configuration of stop members 16 and reinforced portions 15 relative to frame 10 and to moving part 12, micromechanical element 1 has an optimum active surface to passive surface area ratio. Moving part 12 can occupy almost the entirety of inner space 11, including the space located on both sides of beams 14, contrary to that which occurs in the state of the art. The fabrication costs of this type of micromechanical element are thus reduced. Moreover, micromechanical element 1 according to the invention lends itself particularly well to an array arrangement, for which the passive surface saving becomes very significant. This array of micromechanical elements 1 is illustrated in FIG. 2.

Figure 3:
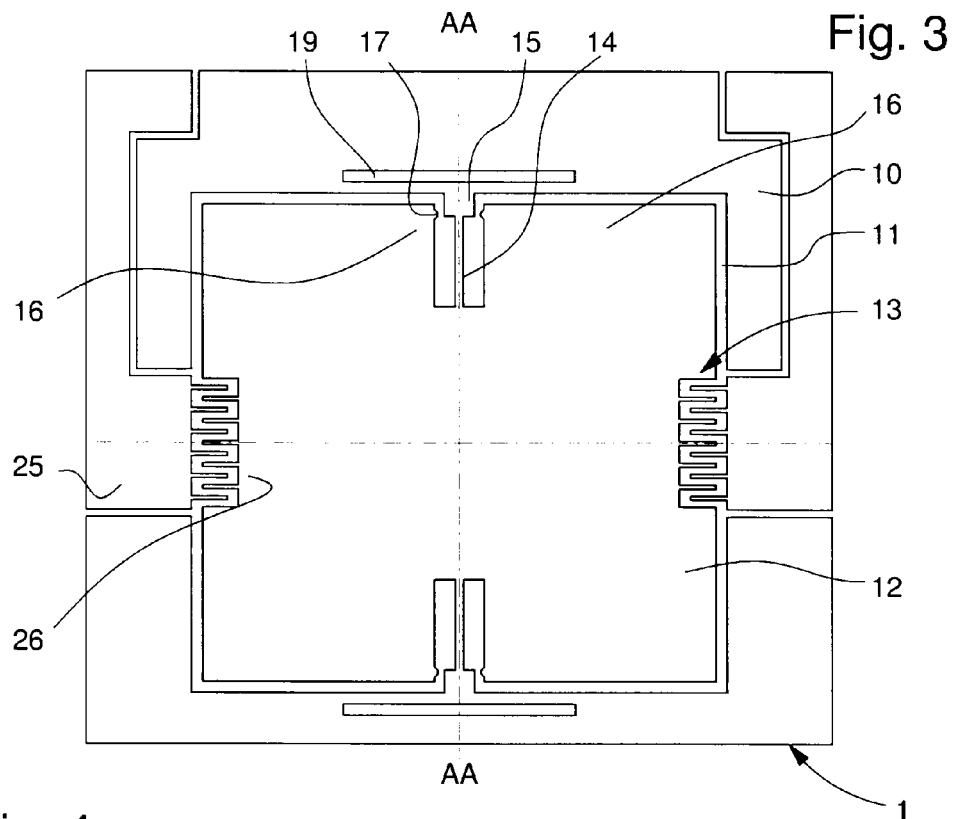
FIG. 3 shows an advantageous variant of the first embodiment of said micromechanical element.

Reference is now made to FIG. 3 which shows an advantageous variant of micromechanical element 1 according to the invention. This embodiment differs from the preceding one in that frame 10 is also provided with two slots 19 extending in proximity to reinforced portions 15, perpendicular to axis AA. These slots 19 give torsion beams 14 longitudinal elasticity for absorbing any acceleration parallel to axis AA, caused by shocks.

Figure 4:
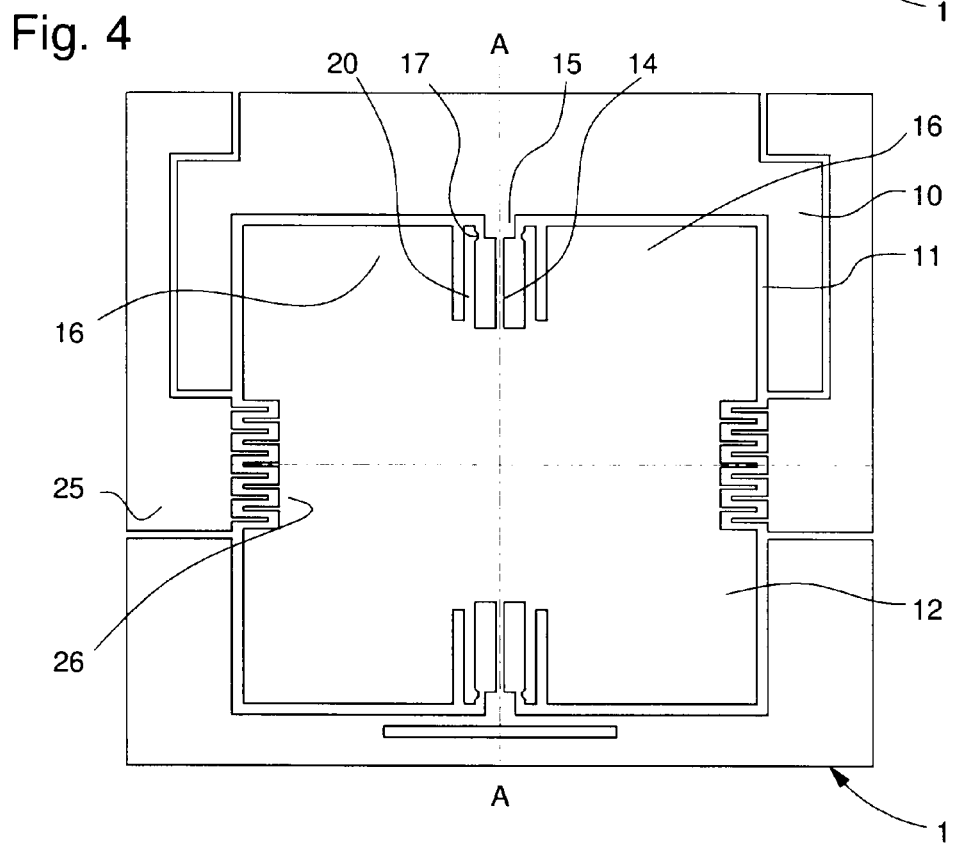
FIG. 4 shows a second embodiment of the micromechanical element.

FIG. 4 shows a second embodiment of the micromechanical element according to the invention. In this embodiment, stop members 16 include a finger 20 extending parallel to torsion beams 14 and exhibiting flexibility perpendicular to axis AA. Fingers 20 are, as previously, provided with a catch 17 projecting in the direction of reinforced portions 15. Owing to fingers 20 and their lateral elasticity, the shock between stop members 16 and reinforced portions 15 is elastic. This property allows a large part of the shock energy to be absorbed in the form of the elastic deformation of fingers 20, which limits any risk of permanent adhesion between reinforced portion 15 and moving part 12. Further, the possibility of any breakage of stop members 16 or reinforced portions 15 in the event of a violent shock is reduced. The operation of micromechanical element 1 and the role of stop members 16 remain unchanged, with the exception of this aspect. It will be noted that, in this second embodiment of a micromechanical element 1 according to the invention, frame 10 can, as previously, include slots 19 with the same function as in the first embodiment.

Thus, a micromechanical element 1 has been described, which is mobile about an axis of rotation AA and provided with an anti-shock structure providing it with an optimum active surface to passive surface area ratio. Of course, this invention is not limited to the embodiments described above, but extends to any variants within the grasp of those skilled in the art, falling within the scope of the claims hereinafter. It will be noted, in particular, that the micromechanical element according to the invention, may be mobile along a first axis of rotation AA and along a second axis of rotation BB perpendicular to axis AA. For this purpose, frame 10 is itself rotatably mounted on a fixed structure, using torsion beams.

What is claimed is:

1. A micromechanical element including:
   a frame,
   a moving part rotating inside said frame, about an axis,
   two torsion beams connecting the moving part to said frame, aligned on the axis and each provided with a portion of reinforced width, and
   stop members arranged on both sides of said reinforced portions, so as to limit the lateral movement of the moving part,
   wherein said portions of reinforced width are integral with the frame, and wherein said stop members are integral with the moving part.

2. The micromechanical part according to claim 1, wherein the moving part extends on both sides of said torsion beams as far as the edge of said frame, so as to form said stop members.

3. The micromechanical element according to claim 1, wherein said stop members include catches extending in the direction of the reinforced portions.

4. The micromechanical element according to claim 1, wherein said stop members are rigid perpendicular to the axis of rotation.

5. The micromechanical element according to claim 1, wherein said stop members include a flexible arm perpendicular to the axis of rotation extending in proximity to the reinforced portion.

6. The micromechanical element according to claim 1, wherein said frame further includes two slots extending perpendicularly to the axis in proximity to the reinforced portions.

7. The micromechanical element according to claim 1, wherein it is formed of silicon.

8. The micromechanical element according to claim 1, wherein the moving part forms a mirror.

9. The micromechanical element according to claim 1, wherein it is activated in rotation by electrostatic combs.

* * * * *